United States Patent [19]

Losavio et al.

[11] Patent Number: 5,598,028
[45] Date of Patent: Jan. 28, 1997

[54] HIGHLY-PLANAR INTERLAYER DIELECTRIC THIN FILMS IN INTEGRATED CIRCUITS

[75] Inventors: Aldo Losavio, Bergamo; Maurizio Bacchetta, Cologno Monzese, both of Italy

[73] Assignee: SGS-Thomson Microelectronics S.r.l., Agrate Brianza, Italy

[21] Appl. No.: 468,282

[22] Filed: Jun. 6, 1995

Related U.S. Application Data

[62] Division of Ser. No. 419,826, Apr. 11, 1995.

[30] Foreign Application Priority Data

Apr. 12, 1994 [EP] European Pat. Off. ............ 94830167

[51] Int. Cl.⁶ .................... H01L 23/58; H01L 23/48
[52] U.S. Cl. .................. 257/644; 257/641; 257/637; 257/650; 257/758
[58] Field of Search .................... 257/324, 637, 257/758, 644, 650, 635, 641

[56] References Cited

U.S. PATENT DOCUMENTS

| | | | |
|---|---|---|---|
| 3,833,919 | 9/1974 | Naber | 257/758 |
| 3,925,572 | 12/1975 | Naber | 427/87 |
| 4,582,745 | 4/1986 | Schnable | 428/209 |
| 4,835,597 | 5/1989 | Okuyama et al. | 257/644 |
| 5,136,344 | 8/1992 | Pronko | 257/637 |
| 5,172,202 | 12/1992 | Kazuo | 257/758 |
| 5,332,924 | 7/1994 | Kobayashi | 257/637 |

FOREIGN PATENT DOCUMENTS

| | | | |
|---|---|---|---|
| 0280276 | 8/1988 | European Pat. Off. | H01L 21/00 |
| 0376479 | 7/1990 | European Pat. Off. | H01L 21/3105 |
| 0396369 | 11/1990 | European Pat. Off. | H01L 21/76 |
| 3-259527 | 11/1991 | Japan . | |

OTHER PUBLICATIONS

Kern et al., "Chemically Vapor–Deposited Borophosphosilicate Glasses for Silicon Device Applications," *RCA Review* 43(3):423–457, Sep. 1982.

*Primary Examiner*—Mahshid Saadat
*Assistant Examiner*—T. M. Arroyo
*Attorney, Agent, or Firm*—Seed and Berry LLP; David V. Carlson

[57] ABSTRACT

A planarization process for the manufacturing of highly-planar interlayer dielectric thin films in integrated circuits, particularly in non-volatile semiconductor memory devices, comprises the steps of: forming a first barrier layer over a semiconductor substrate wherein integrated devices have been previously obtained; forming a second layer of oxide containing phosphorous and boron over the first undoped oxide the concentration of boron being lower than the concentration of phosphorous; forming a third layer of oxide containing phosphorous and boron over the second oxide layer, the concentration of phosphorous being lower than or equal to the concentration of boron; performing a thermal process at a temperature sufficient to melt the third oxide layer, to obtain a planar surface.

16 Claims, 3 Drawing Sheets

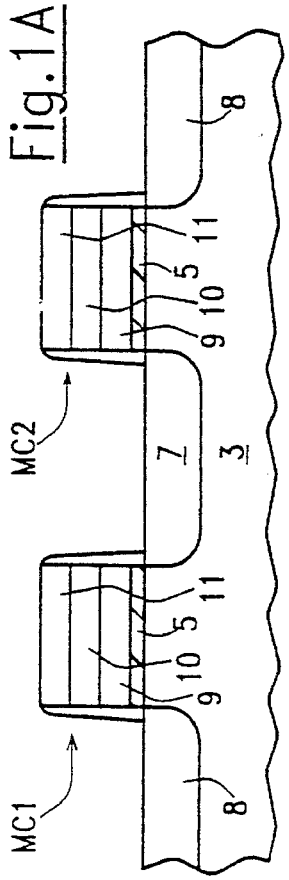
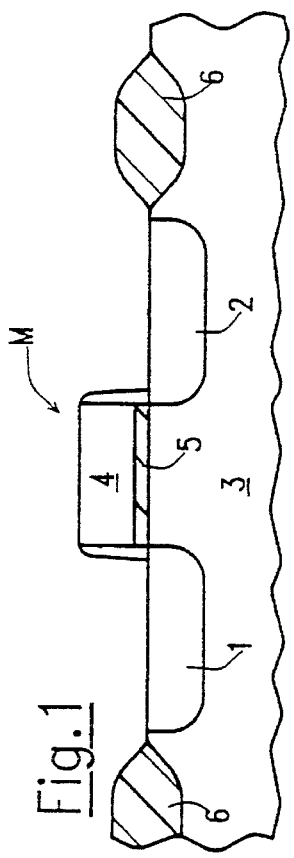
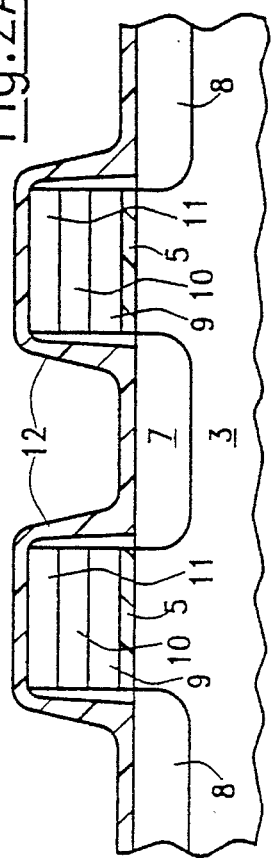
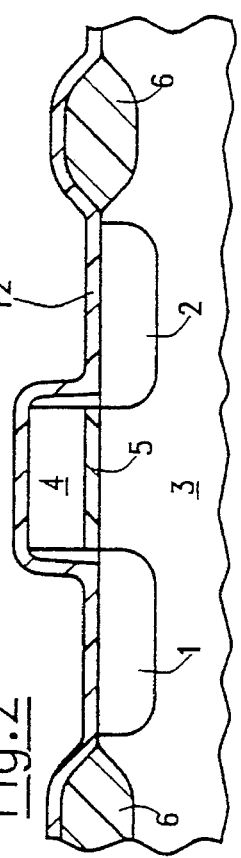
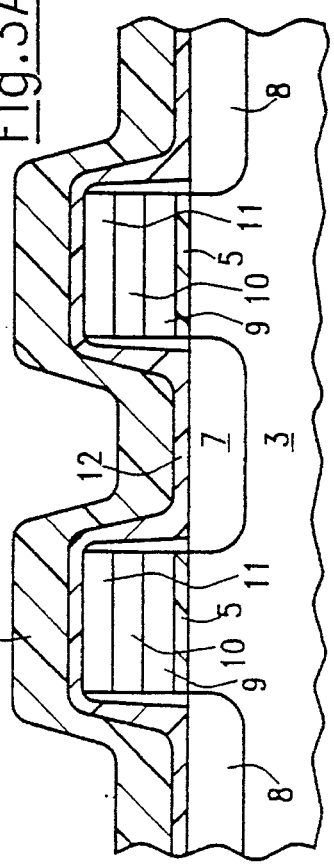
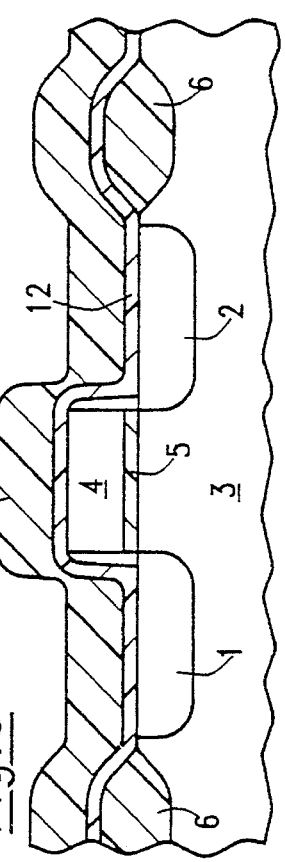

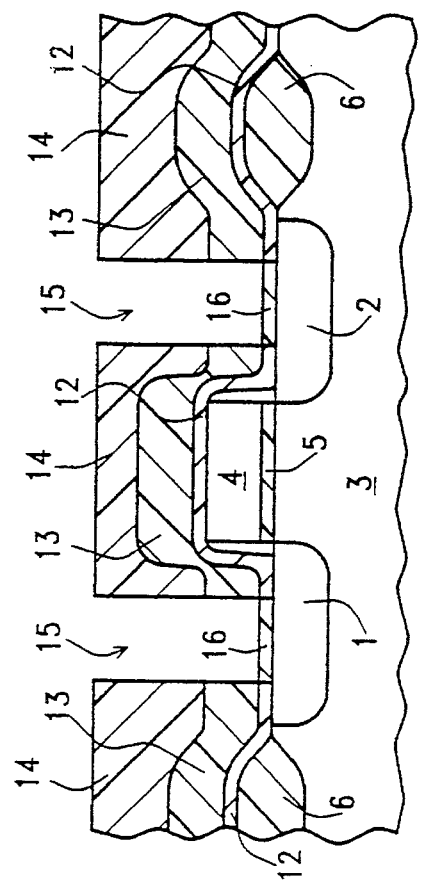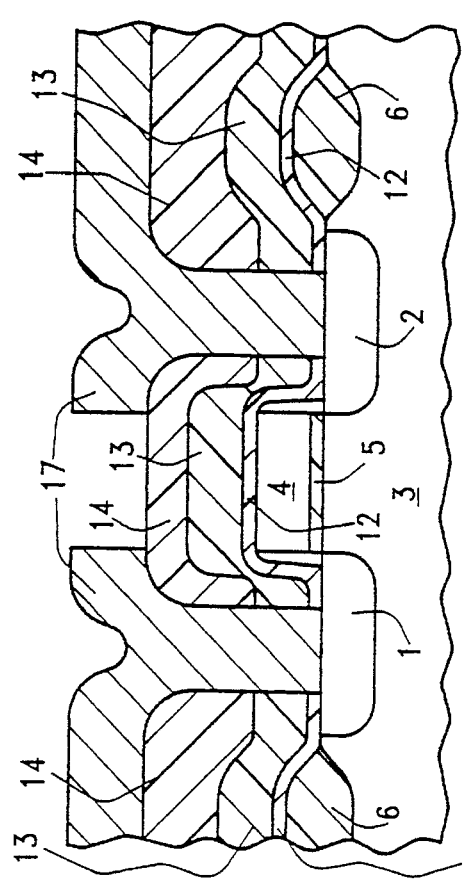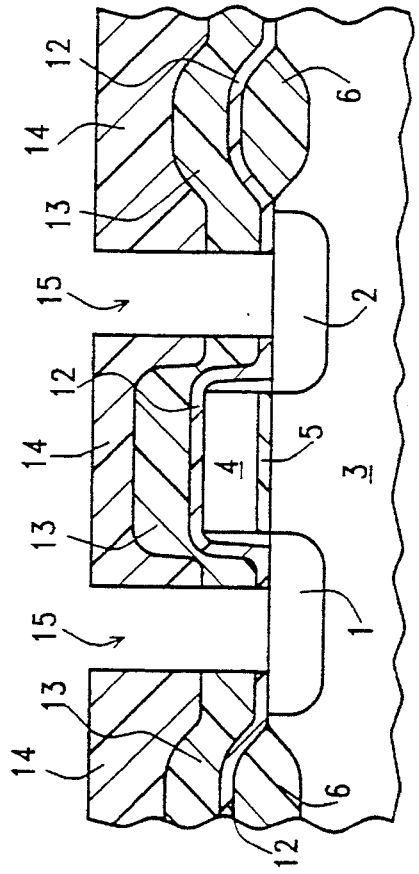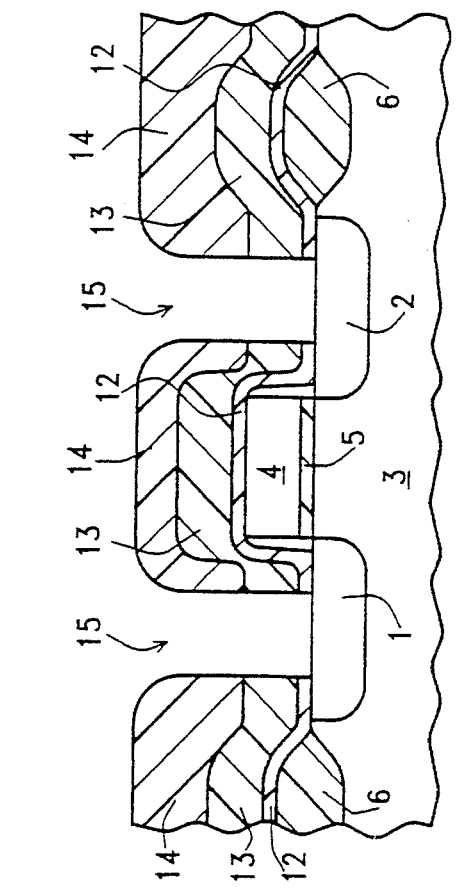
Fig. 6
Fig. 7
Fig. 8
Fig. 9

HIGHLY-PLANAR INTERLAYER DIELECTRIC THIN FILMS IN INTEGRATED CIRCUITS

CROSS-REFERENCE TO RELATED APPLICATION

This application is a division of U.S. patent application Ser. No. 08/419,826, filed Apr. 11, 1995.

TECHNICAL FIELD

The present invention relates generally to semiconductor processes and more specifically to a planarization process for the manufacturing of highly-planar interlayer dielectric thin films in integrated circuits, particularly in non-volatile semiconductor memory devices.

BACKGROUND OF THE INVENTION

Dielectric thin films are used in integrated circuits, for example, to provide insulating layers between different electrically-conductive layers: in MOS technology, for example, such films are used to electrically insulate the polysilicon gates of the MOS transistors from the overlaying metal interconnection lines.

Dielectric thin films are commonly represented by oxide layers doped with boron and phosphorous (known as "Boron-Phosphorous Silicate Glass" or "BPSG"). These layers are deposited by means of the Chemical Vapor Deposition ("CVD") technique.

BPSG films allow the formation of a planar surface over the substrate wherein circuit devices are integrated. To this end, after their deposition, the oxide films undergo a thermal process ("reflow") in furnaces or in Rapid Thermal Annealers ("RTA") at temperatures near their melting point (800–1000° C.) to obtain a planar surface.

The melting-point temperature of such films depends on their doping level, and for a given total impurity concentration (sum of the phosphorous and boron concentrations), decreases for higher boron concentrations.

Some integrated circuits, such as non-volatile memory devices (EPROMs and Flash EPROMs), often require BPSG films with high phosphorous concentrations (typically over 6%), since phosphorous atoms act as gettering centers for high-mobility metal impurity species that may cause a performance degradation of the memory cells (i.e., leakage of charges stored in the floating gates, causing the loss of the stored information). Such a planarization process is difficult to perform for non-volatile semiconductor memory devices such as EPROM and Flash EEPROM. Since to achieve stable BPSG films the total impurity concentration must not exceed a given value, the boron concentration must be low (less than 3%), and the resulting melting-point temperature is too high and not compatible with the new-generation integrated devices. Such a high melting-point temperature prevents an effective planarization of the surface of the BPSG film from being achieved.

EP-A-0280276 discloses an UV erasable nonvolatile semiconductor memory device having an interlayer insulation film between memory elements and an upper metal wiring layer. The interlayer insulation film comprises a thermal oxide film formed on a semiconductor substrate, a phosphorus doped oxide (PSG) film formed on the thermal oxide film, and a boron and phosphorus doped (BPSG) film formed on the PSG film. The PSG film improves the UV transmissive properties of the insulation film. After its deposition, the BPSG film is reflowed by means of a thermal process at 900° C.

Such an interlayer insulation film has two major drawbacks: first, since the PSG film has a melting temperature substantially higher than that of the BPSG film, it does not reflow at 900° C., and thus does not aid in the formation of a highly planar interlayer insulation film. Second, if cleaning of the bottom of the contact windows is carried our by wet etching, such as by means of hydrofluoric acid-based solutions, then the contact windows may be deformed, because the PSG film etch rate is substantially higher than that of the BPSG film.

SUMMARY OF THE INVENTION

In view of the state of the prior art described, it is an object of the present invention is to provide a planarization process suitable to obtain dielectric thin films with highly planar surfaces without the need of high-temperature thermal steps, and thus suitable to be used in the fabrication of particular integrated circuits, such as non-volatile semiconductor memory devices, which may not be compatible with high-temperature thermal steps.

According to the present invention, such object is attained by means of a planarization process for the manufacturing of highly-planar interlayer dielectric thin films in integrated circuits, particularly in non-volatile semiconductor memory devices, characterized by comprising the steps of:

a) forming a first barrier layer over a semiconductor substrate, wherein integrated devices have been previously formed;

b) forming a second layer of oxide containing phosphorous and boron over said first undoped oxide layer, the concentration of phosphorous being higher than that of boron;

c) forming a third layer of oxide, containing phosphorous and boron over said second oxide layer.

d) performing a thermal process at a temperature sufficient to melt the third oxide layer to obtain a planar surface.

The dielectric thin film thus obtained comprises a first BPSG film or layer, having a high concentration of phosphorous and a low concentration of boron, that performs a gettering action for mobile metal ions, and a second BPSG layer with a high concentration of boron and thus with a low melting-point temperature. Such a dielectric thin film forms a highly planar surface when subjected to a thermal treatment at temperatures compatible with many integrated circuit manufacturing processes, particularly with a fabrication process for non-volatile memory devices.

BRIEF DESCRIPTION OF THE DRAWINGS

The features of the present invention will be made more evident by the following drawings which are provided as a non-limiting example of the inventive concept, wherein:

FIGS. 1 to 5 are cross-sectional views taken at intermediate steps of a planarization process according to the present invention as it is applied to the fabrication of a MOSFET;

FIGS. 1A to 5A are cross sectional views taken at the same intermediate steps of FIGS. 1–5 that show the planarization process according to the invention as it is applied to the fabrication of non-volatile memory cells; and FIGS. 6 to 9 are cross-sectional views showing further successive steps of the fabrication process of the MOSFET of FIGS. 1–5.

DETAILED DESCRIPTION OF THE INVENTION

Figure 4A:
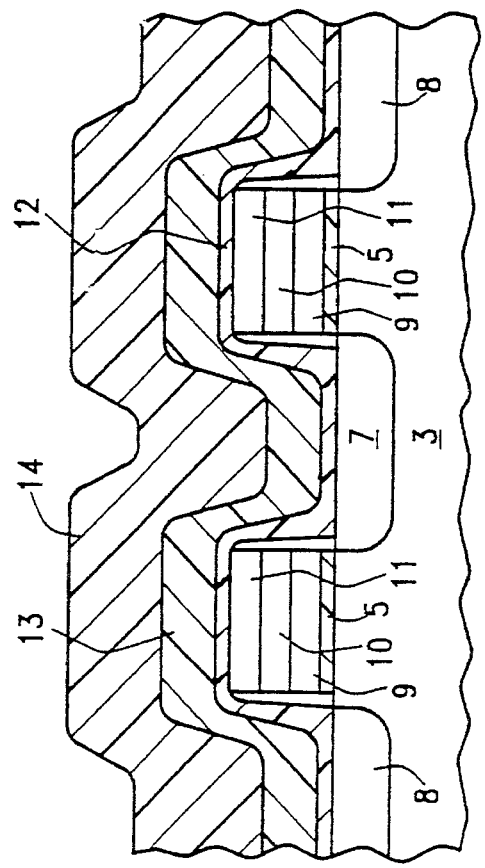

The planarization process according to the present invention is now described taking as an example the fabrication of a MOS integrated circuit, in particular a non-volatile semiconductor memory device.

FIGS. 1 and 1A respectively illustrate a MOSFET M and two stacked-gate non-volatile memory cells MC1 and MC2, and can be considered to represent two distinct regions, i.e. a peripheral region and a memory matrix region, of a non-volatile semiconductor memory device. Both the MOSFET M and the two memory cells MC1 and MC2 have been obtained in a conventional way using any known manufacturing processes.

The MOSFET M comprises in a per-se known way a source region 1 and a drain region 2 obtained by introducing dopant species into a semiconductor substrate 3. A polysilicon gate 4, separated from the substrate 3 by a thin gate oxide layer 5, extends between the source and drain regions 1 and 2. Thick field oxide areas 6 are provided adjacent the MOSFET M.

The two memory cells MC1 and MC2 comprise a common source region 7, and drain regions 8 obtained in the semiconductor substrate 3. A polysilicon floating gate 9, separated from the substrate 3 by the thin gate oxide layer 5, extends between the drain region 8 and the source region 7 of each memory cell MC1 and MC2. An interpoly dielectric layer 10 is superimposed on and autoaligned with the floating gate 9, and a polysilicon control gate 11, representing a so-called "word line" of the memory matrix, is further superimposed over the interpoly dielectric layer 10.

The polysilicon gate 4 of the MOSFET M and the polysilicon control gates 11 of the memory cells MC1 and MC2 constitute first-level electrical interconnection lines.

Referring to FIGS. 2 and 2A and according to the planarization process of the present invention a first undoped layer 12 is deposited over the whole integrated circuit surface by means of, for example, a known Low-Pressure Chemical Vapor Deposition ("LPCVD") technique at atmospheric pressure (Atmospheric-Pressure CVD or "APCVD") or sub-atmospheric pressure (Sub-Atmospheric-pressure CVD or "SACVD"). Plasma-Enhanced CVD ("PECVD") can also be used. The thickness of the first undoped layer 12 is optimized to assure suitable barrier properties against the diffusion of dopant species from layers that will overlay it into layers below it and into the semiconductor substrate 3. Such diffusion could alter the desired doping levels of the previously obtained source and drain regions 1, 2, 7 and 8. A good compromise is generally achieved by making the thickness of the first layer 12 about 100 nm or less. The thickness of such layer can, however, vary from approximately 50 nm to 300 nm. A preferred material for the layer 12 is an oxide layer, such as $SiO_2$ or other acceptable oxide. Alternatively, the layer 12 can be a silicon nitride ($Si_3N_4$) layer or a silicon oxinitride (SiON) layer. Both these materials exhibit good barrier properties against the diffusion of dopants.

Referring to FIGS. 3 and 3A, a second oxide layer 13 is then deposited over the first undoped oxide layer 12 by either of the above-mentioned APCVD or SACVD techniques, which include introducing in the reaction chamber both gaseous species, such as $SiH_4$, $PH_3$, $B_2H_6$, or liquid species, such as $Si(OC_2H_5)_4$ (Tetra-Ethyl-Ortho-Silicate Or "TEOS"), $B(OCH_3)_3$ (Tri-Methyl-Borfate or "TMB"), or $P(OCH_3)_3$ (Tri-Methyl-Phosphite or "TMP").

This second oxide layer 13 is doped with boron and phosphorous, but the concentration of phosphorous is higher than that of boron, and is chosen to achieve a good gettering action for the high-mobility metal ions. Given the phosphorous concentration, the concentration of boron is chosen to achieve a stable deposited film. For a concentration of phosphorous higher than 6%, the boron is typically present in a concentration lower than 3%. For example, suitable concentration values are 9% for phosphorous and 2% for boron.

The thickness of the second oxide layer 13 is determined on the basis of the amount of phosphorous that is necessary to assure the desired gettering action, and should be as thin as possible. Typical thickness values range from 80 nm to 500 nm.

If the thickness of the second oxide layer 13 approaches a high value (>300nm), then a preliminary thermal step can be carried out in order to improve the surface topography. Since, however, the second oxide layer 13 contains more phosphorous than boron, its resulting melting point temperature can be higher than the maximum temperature allowed by many manufacturing processes (such as the manufacturing process for the non-volatile memory device under consideration). Thus, it may be difficult to implement such a preliminary step.

Figure 4:
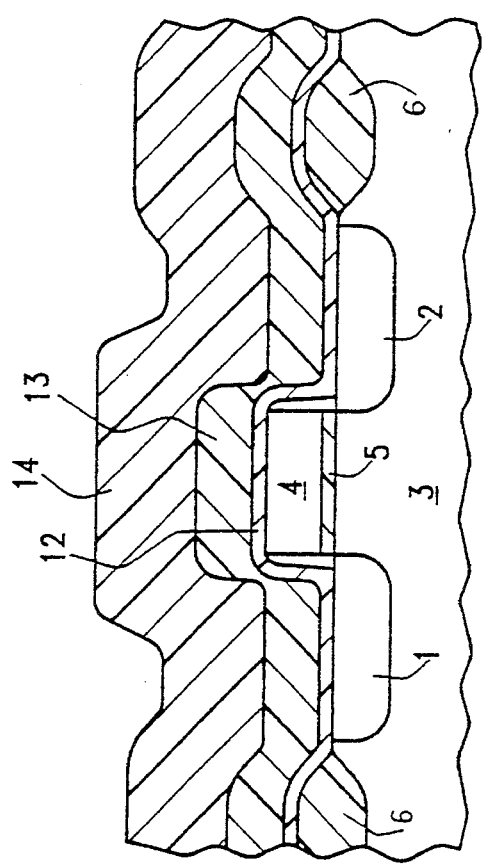

Referring to FIGS. 4 and 4A, a third oxide layer 14 is then deposited, by means of the above-cited CVD techniques, over the second oxide layer 13. The third oxide layer 14 is also doped with boron and phosphorous, but the concentration of boron in layer 14 is equal to or higher than the concentration of phosphorous. The concentration of boron is chosen in such a way as to lower the melting-point temperature of the oxide layer 14 to a desired value. If, for example, the maximum temperature allowed by the particular process is 900° C., a concentration of boron of about 4–5% is suitable. Given the boron concentration, the concentration of phosphorous is chosen to achieve a stable film (4% in the above example). The thickness of this third oxide layer 14 depends on the desired thickness (generally ranging from 500 nm to 1500 nm) for the overall triple-layer comprising the first, the second and the third oxide layers 12, 13 and 14, and on the thickness of the first and second oxide layers 12 and 13.

In one aspect of the invention, the second and third oxide layers 13 and 14 can be sequentially deposited by means of a unique single deposition step made up of two stages. A first stage, during the deposition of the second oxide layer 13, entails introducing into the reaction chamber the proper concentration of, for example, $PH_3$ and $B_2H_6$. A second stage, during the deposition of the third oxide layer 14, entails changing the gaseous species concentration in the reaction chamber. In such a process, the second and third oxide layers 13 and 14 actually constitute a single layer, but with a different concentration of dopants along its thickness, i.e., a nonzero doping gradient. The variation in the dopant concentration can be made abrupt, as if two distinct films were present by an abrupt change in gas concentration, or gradual by gradually varying the fluxes of gaseous species in the reaction chamber. The deposition of layers 13 and 14 thus occurs as a single step in this alternative embodiment. The relative concentration of dopants in the final layer portion changes from the bottom surface portion to the top surface because the dopants' concentration introduced into the layer changes during the formation of the layer.

Figure 5A:
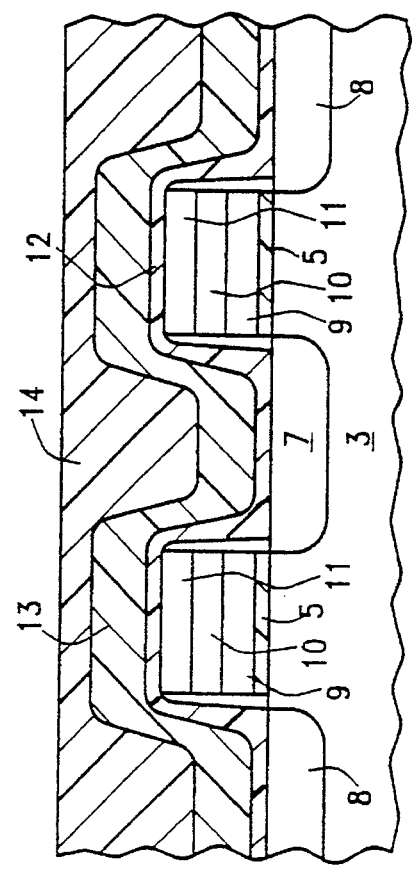
Figure 5:
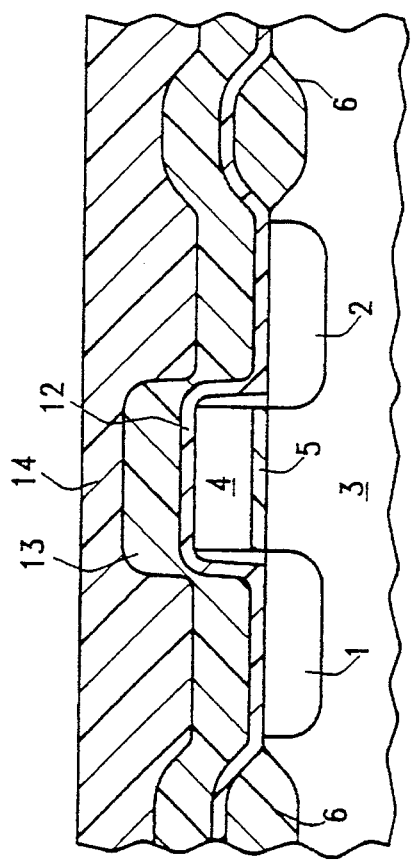

Referring to FIGS. 5 and 5A, a thermal process is then performed to cause the reflow of the third oxide layer 14, so that the surface of the integrated circuit can be planarized. Due to the high concentration of boron, the third oxide layer 14 has a low melting-point temperature, so that temperatures lower than 900° C. (which are compatible with the manufacturing process of non-volatile memory devices) are sufficient for the reflow to occur. After this thermal process, the degree of planarization of the surface of the integrated circuit is quite high.

FIGS. 6–9 illustrate further processing steps with regard to MOSFET M. The discussion associated with these figures is, however, applicable to memory cells MC1 and MC2.

Referring to FIG. 6, the triple oxide layer 12, 13 and 14 may then be selectively removed down to the surface of the substrate 3 to open contact windows 15.

Referring to FIG. 7, after opening contact windows 15, dopant species are implanted therethrough and diffused into selected regions of the substrate 3 to assure the formation of good ohmic contacts. During the thermal diffusion step, a thermal oxide layer 16 is formed over the exposed regions of the substrate 3 as a natural result.

Referring to FIG. 8, to remove the thermal oxide layer 16, a cleaning step is performed. A conventional technique provides for using wet-etching solutions of diluted hydrofluoridic acid (HF). The use of a double BPSG layer (i.e., the second and third oxide layers 13 and 14) over a barrier oxide layer 12 is advantageous in that the second and the third layers of oxide 13 and 14 are etched at almost the same rate by the wet-etching solutions. On the other hand, if the second oxide layer 13 contained only phosphorus, then it would be overetched with respect to the third oxide layer 14 because of the large difference between the two etch rates. Such an overetch may render window profile 15 deformed and thus unfit to be filled by the metal interconnection layer 17 (FIG. 9). If, however, the thermal oxide layer 16 is removed by dry-etching, instead of wet-etching, the second oxide layer 13 can contain only phosphorous, and not boron, with a reduced risk that profile 15 will be deformed. In this case, as discussed above, the second oxide layer 13 will be a Phospho-Silicate Glass or "PSG".

Referring to FIG. 9, a metal interconnection layer 17 is then deposited over the planarized surface of the integrated circuit, and is selectively etched or otherwise removed to give rise to the desired pattern of metal interconnection lines.

Even though the planarization process according to the present invention has been described in connection with the manufacturing of a MOS integrated circuit, particularly a non-volatile memory device, it can be used for the fabrication of integrated circuits in general. The planarization process according to the invention is particularly suitable to obtain highly planar dielectric films that do not require thermal processing at high temperatures.

While the present invention has been described with reference to particular embodiments thereof, those skilled in the art will know of various changes in form that may be made without departing from the spirit and scope of the claimed invention as defined in the appended claims.

We claim:

1. An integrated circuit comprising a silicon substrate wherein electronic devices are obtained, comprising first-level electrical interconnection lines over said substrate and second-level electrical interconnection lines, the first-level and second-level electrical interconnection lines being separated by an insulating layer, characterized in that the insulating layer comprises:

a barrier layer superimposed over the first-level electrical interconnection lines;

a first insulator material layer doped with phosphorous and boron, superimposed over the barrier layer, having a concentration of phosphorous higher than a concentration of boron, the concentration of phosphorous being suitable to make the first insulator material layer act as a gettering layer for high-mobility ions and the concentration of boron depending on the concentration of phosphorous and being suitable to make the first insulator material layer stable; and a generally planar second insulator material layer doped with boron and phosphorous, superimposed over the first insulator material layer, having a concentration of boron in the second insulator material layer equal to or higher than a concentration of phosphorous in the second insulator material layer, the concentration of boron being suitable to lower a melting-point temperature of the second insulator material layer to a prescribed value and the concentration of phosphorous being suitable to make the layer stable.

2. The integrated circuit according to claim 1, characterized in that the concentrations of boron and phosphorous in the second insulator material layer are 4–5% and 4%, respectively.

3. The integrated circuit according to claim 2, characterized in that the concentrations of phosphorous and boron in the first insulator material layer are higher than 6% and lower than 3%, respectively.

4. A semiconductor device, comprising: a substrate;

first-level electrical interconnections disposed on said substrate;

a barrier layer disposed on said interconnections;

a first insulator material layer disposed on said barrier layer and including a first concentration of boron and a second concentration of phosphorous greater than said first concentration;

a substantially planar second insulator material layer disposed on said first insulator material layer and including a third concentration of boron and a fourth concentration of phosphorous less than said third concentration; and second-level electrical interconnections disposed on said second insulator material layer.

5. The semiconductor device of claim 4, characterized in that the concentration of phosphorous in the first layer is suitable to make the first layer act as a gettering layer for high-mobility ions.

6. The semiconductor device of claim 4, characterized in that the substantially planar second layer having a concentration of boron being suitable to lower a melting-point temperature of the second insulator material layer to a prescribed value, and the concentration of phosphorous depending on the concentration of boron and being suitable to have a stable second layer.

7. The semiconductor device of claim 6, characterized in that the prescribed value is at a temperature of approximately 900° C.

8. The semiconductor device of claim 4, characterized in that the concentrations of boron and phosphorous in the second layer are 4–5% and 4%, respectively.

9. The semiconductor device of claim 4, characterized in that the concentrations of phosphorous and boron in the first layer are in the range of 6–9% and lower than 3% respectively.

10. The semiconductor device of claim 4, characterized in that the barrier layer is a silicon oxide layer.

11. The semiconductor device of claim 4, characterized in that the barrier layer has a thickness in the range 50 to 300 nm.

12. The semiconductor device of claim 4, characterized in that the first layer has a thickness in the range 80 nm to 500 nm.

13. The semiconductor device of claim 4, characterized in that said barrier layer is a silicon nitride layer.

14. The semiconductor device of claim 4, characterized in that said barrier layer is a silicon oxinitride layer.

15. A semiconductor device comprising:
   a) a substrate;
   b) first-level electrical interconnections disposed on said substrate;
   c) a barrier layer superimposed over said interconnections;
   d) a first layer of insulator material containing phosphorous and boron superimposed over said barrier layer, the concentration of boron being lower than 3% and the concentration of phosphorous being in the range of 6–9%, the first insulator material layer being stable and performing a gettering action on high-mobility ions;
   e) a second layer of insulator material containing phosphorous and boron directly over the first layer of insulator material, the concentration of boron being equal to 4–5% and the concentration of phosphorous being equal to 5%, the second insulator material layer being stable and having a prescribed melting-point temperature to melt the material layer to obtain a planar surface; and
   f) second-level electrical interconnections superimposed over said second insulator material layer.

16. The semiconductor device of claim 15, characterized in that the first layer has a boron concentration of approximately 2% and a phosphorous concentration of approximately 9%.

\* \* \* \* \*